United States Patent
Lee et al.

[11] Patent Number: 5,940,705
[45] Date of Patent: Aug. 17, 1999

[54] METHODS OF FORMING FLOATING-GATE FFRAM DEVICES

[75] Inventors: Byoung-taek Lee; Cheol-seong Hwang, both of Kyungki-do, Rep. of Korea

[73] Assignee: Samsung Electronics Co., Ltd., Rep. of Korea

[21] Appl. No.: 08/974,084

[22] Filed: Nov. 19, 1997

[30] Foreign Application Priority Data

Jan. 10, 1997 [KR] Rep. of Korea .......................... 97-519

[51] Int. Cl.⁶ ................................................. H01L 21/336
[52] U.S. Cl. .................... 438/258; 438/266; 438/241; 438/152; 438/3
[58] Field of Search .................................. 438/257, 258, 438/266, 261, 241, 152, 3

[56] References Cited

U.S. PATENT DOCUMENTS

| | | | |
|---|---|---|---|
| 5,345,414 | 9/1994 | Nakamura | 365/145 |
| 5,675,530 | 10/1997 | Hirano et al. | 365/145 |
| 5,675,536 | 10/1997 | Sim | 365/185.22 |
| 5,675,537 | 10/1997 | Bill et al. | 365/185.22 |
| 5,770,483 | 6/1998 | Kadosh et al. | 438/152 |
| 5,834,341 | 11/1998 | Chen | 438/152 |

*Primary Examiner*—John F. Niebling
*Assistant Examiner*—John Murphy

*Attorney, Agent, or Firm*—Myers Bigel Sibley & Sajovec

[57] ABSTRACT

Methods of forming floating-gate ferroelectric random-access-memory (FFRAM) devices include the steps of forming vertically integrated FFRAM unit cells having floating-gate transistors and access transistors positioned at different levels on a semiconductor substrate to increase the density at which the unit cells may be integrated. Preferred methods include the steps of forming a first transistor having opposing floating and control gate electrodes, at a surface of a semiconductor substrate, and then forming a first insulating layer having a first contact hole therein, on the first transistor. The first transistor comprises a layer of ferroelectric material between the floating and control gate electrodes, which can be polarized in respective first and second states to retain logic 1 and logic 0 data. Steps are then performed to form a first electrical interconnect (e.g., conductive plug) in the first contact hole and electrically coupled to the control gate electrode. Then, a series of steps are performed to form a vertically integrated second transistor on the first insulating layer. Here, the second transistor is formed as a field effect transistor having a drain region electrically coupled to the control gate of the first transistor by the first electrical interconnect. The steps of forming a second transistor may include the steps of forming a silicon-on-insulator (SOI) substrate on the first insulating layer, forming a gate electrode on the silicon portion of the SOI substrate, and then forming source, drain and channel regions in the silicon portion of the SOI substrate.

13 Claims, 6 Drawing Sheets

METHODS OF FORMING FLOATING-GATE FFRAM DEVICES

FIELD OF THE INVENTION

The present invention relates to methods of forming integrated circuit memory devices and devices formed thereby, and more particularly to methods of forming ferroelectric memory devices and devices formed thereby.

BACKGROUND OF THE INVENTION

Integrated circuit memory devices containing ferroelectric memory cells therein typically contain ferroelectric capacitors to store data. As will be understood by those skilled in the art, ferroelectric capacitors typically comprise a pair of electrodes with a layer of ferroelectric material therebetween having hysteresis characteristics. The ferroelectric material can typically be polarized in a first or second opposite polarization state and this state is nonvolatile inasmuch as the application of a zero potential bias across the pair of electrodes will not result in a change or elimination of the state. The first and second polarization states can be utilized to reflect the storage of logic 0 and logic 1 data signals, respectively.

Furthermore, memory devices using ferroelectric thin films can be divided into two types. One type is a memory device in which a capacitor is manufactured using the ferroelectric material and bidirectional signals stored in the capacitor are read and written using an access transistor. The memory device may be manufactured using one transistor and one capacitor (1T/1C) or two transistors and two capacitors (2T/2C). Such memory devices are typically referred to as ferroelectric RAM (FRAM) devices because their operation is similar to the operation of convention dynamic RAM devices. However, FRAM devices typically do not require a regular refresh operation and store data in nonvolatile states so that data is not erased even if the power supply is interrupted, as described above.

Unfortunately, many conventional ferroelectric memory devices perform destructive read operations when the state of polarization of a ferroelectric capacitor (i.e., the data stored therein) is detected. For example, a destructive read operation may occur when the state of polarization of a ferroelectric capacitor is switched from one state to another opposite state upon application of a read voltage across the terminals of the ferroelectric capacitor. To prevent the complete loss of this state (e.g., data), restore operations are typically performed to return the ferroelectric capacitor to the state in existence just prior to the performance of the read operation. Unfortunately, the need to perform restore operations after each read operation increases the effective read cycle time and slows operation of the memory device. Each destructive read operation and each restore operation can also fatigue and imprint the ferroelectric material and reduce the long term reliability of memory devices containing ferroelectric memory cells. Finally, the need to perform restore operations leaves the memory device vulnerable to power failures because the loss of power during the middle of a restore operation may result in the complete loss of data if the data is read in a destructive manner as described above.

Another type of memory device which can be read nondestructively is typically referred to as a nondestructive read out (NDRO) ferroelectric memory device. In this memory device, a ferroelectric gate capacitor is formed on a gate electrode of a transistor. Here, unlike in a conventional DRAM or FRAM, a capacitor is formed on a single transistor, which is advantageous for high-integration. However, like the conventional DRAM, an additional transistor for selecting a cell (i.e., an access transistor or a select transistor) is necessary for performing a random access operation. The above NDRO ferroelectric memory device is typically referred to as a ferroelectric floating gate RAM, i.e., FFRAM.

The FFRAM has various advantages over a nonvolatile memory device such as a flash memory device which requires the tunneling of electrons through a tunnel oxide. First, the life cycle of a FFRAM is typically much larger than that of the flash memory which may suffer from tunnel oxide deterioration. In the event platinum, is used as an electrode of the capacitor in the FFRAM, there may also be a problem with fatigue, however, the recording frequency may be approximately $10^9$ times. Also, in the event an electrode of the capacitor is replaced with a conductive oxide, the recording frequency can be as high as $10^{14}$–$10^{15}$ times. Also, in the FFRAM, a thickness of a ferroelectric thin film can be carefully controlled to reduce a coercive voltage (i.e., the minimum voltage required for inverting the spontaneous polarization of the ferroelectric material). That is, an operation starting voltage of the FFRAM can be reduced by 3V–5V. Accordingly, programming operations can be performed at low voltages. Also, the period of time required for polarization inversion of the FFRAM (which is approximately 10 nanosec.) is typically shorter than that for the tunneling of electrons through a gate oxide layer of a flash memory. Accordingly, in the FFRAM, a nonvolatile nondestructive memory device that can be operated at low voltages and at high speed can be realized.

Unfortunately, when PZT is used as the ferroelectric material, a chemical reaction may occur with a substrate or a silicon oxide layer containing a silicon component. To address this problem, $IrO_2$ has been considered as an electrode material when PZT is used as the ferroelectric material. An exemplary FFRAM is disclosed in U.S. Pat. No. 5,345,414 to Nakamura entitled "Semiconductor Memory Device Having Ferroelectric Film". In this FFRAM, a ferroelectric transistor is used as a memory device, a second transistor is used for writing and erasing and a third transistor is used for reading. Accordingly, each memory cell contains three transistors which are spaced at adjacent locations in a semiconductor substrate. However, notwithstanding the attempts to develop FFRAM devices having improved electrical and layout characteristics, there continues to be need for improved and more highly integrated FFRAM devices.

SUMMARY OF THE INVENTION

It is therefore an object of the present invention to provide improved methods of forming floating-gate FRAM devices and devices formed thereby.

It is still another object of the present invention to provide methods of forming floating-gate FRAM devices having highly integrated access transistors therein and devices formed thereby.

It is a further object of the present invention to provide methods of forming floating-gate FRAM unit cells having reduced lateral dimensions and unit cells formed thereby.

These and other objects, advantages and features of the present invention are provided by methods of forming floating-gate ferroelectric random-access-memory (FFRAM) devices that include the steps of forming vertically integrated FFRAM unit cells having floating-gate transistors and access transistors positioned at different levels on a semiconductor substrate to increase the density at which the unit cells may be integrated. In particular, preferred methods include the steps of forming a first transistor having opposing floating and control gate electrodes, at a surface of a semiconductor substrate, and then forming a first insulating layer having a first contact hole therein, on the first transistor. Preferably, the first transistor comprises a layer of ferroelectric material between the floating and control gate electrodes, which can be polarized in respective first and second states to retain logic 1 and logic 0 data. Steps are then performed to form a first electrical interconnect (e.g., conductive plug) in the first contact hole and electrically coupled to the control gate electrode. Then, a series of steps are performed to form a vertically integrated second transistor on the first insulating layer. Here, the second transistor is formed as a field effect transistor having a drain region electrically coupled to the control gate of the first transistor by the first electrical interconnect. The steps of forming a second transistor may include the steps of forming a silicon-on-insulator (SOI) substrate on the first insulating layer, forming a gate electrode on the silicon portion of the SOI substrate, and then forming source, drain and channel regions in the silicon portion of the SOI substrate.

According to one embodiment of the present invention, the steps of forming a second transistor may also include the steps of forming a second contact hole in the silicon-on-insulator substrate, to expose the first electrical interconnect and then forming a second electrical interconnect (e.g., conductive plug) in the second contact hole so that a subsequently formed drain region of the second transistor may be electrically coupled to the control gate electrode of the first transistor. A bit line is also preferably coupled through a respective contact hole to a source region in the second transistor.

According to another embodiment of the present invention, the steps of forming a second transistor include the steps of forming a second insulating layer on the first insulating layer and then forming a second contact hole in the second insulating layer, to expose the first electrical interconnect. A layer of nonmonocrystalline silicon is then deposited on the second insulating layer and in the second contact hole. The deposited layer of nonmonocrystalline silicon may then be patterned. After patterning, an insulated gate electrode may be formed on the deposited layer of nonmonocrystalline silicon and then source and drain regions may be formed using self-alignment techniques. Moreover, in the event the layer of nonmonocrystalline silicon comprises amorphous silicon, a step may be performed to recrystallize the layer of amorphous silicon as polycrystalline silicon.

According to still another embodiment of the present invention, a preferred memory device comprises a first transistor having floating and control gate electrodes, at a surface of a semiconductor substrate, and an insulating layer having a first contact hole therein, on the first transistor. To provide high levels of vertical integration, a second access transistor is provided on the insulating layer and is coupled through the first contact hole to the control gate of the first transistor. Here, the first transistor preferably contains a layer of ferroelectric material extending between the floating and control gate electrodes. The second transistor may also include a layer of silicon buried in the insulating layer as an SOI substrate.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Figure 1:
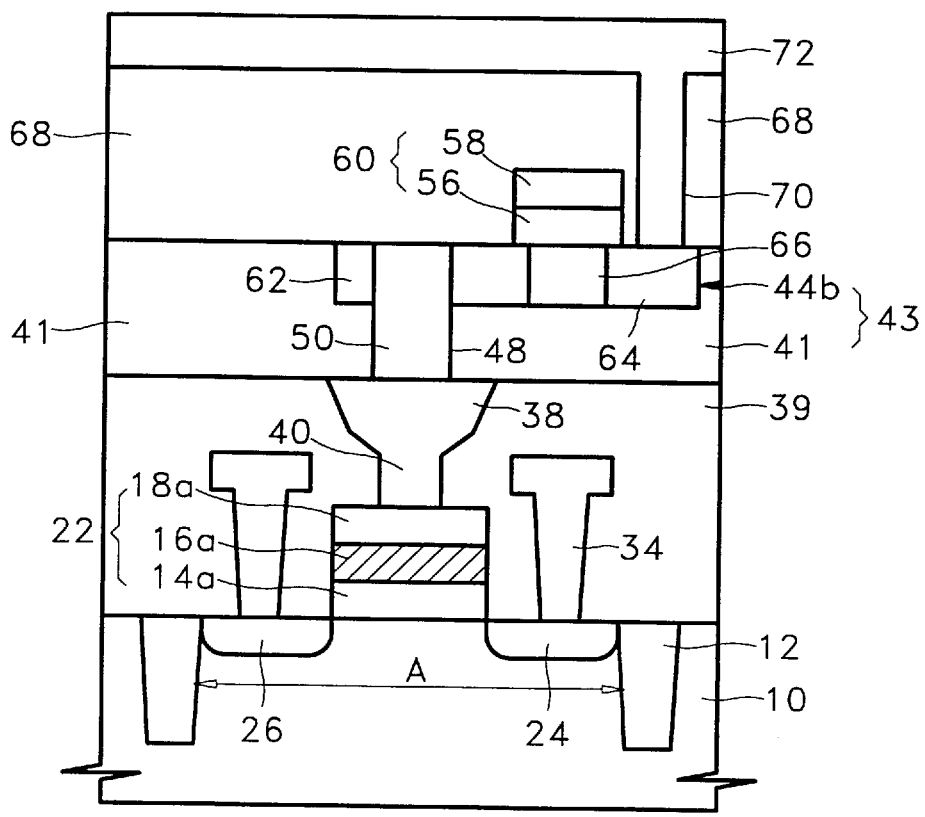
FIG. 1 is a cross-sectional view of a floating-gate FRAM memory device according to an embodiment of the present invention.

Referring to FIG. 1, a field oxide layer 12 that defines an active region 'A' and a field region is formed on a semiconductor substrate 10. The field oxide layer 12 is preferably formed in a trench using STI techniques. A first structure having a first transistor with a first gate of stacked material 22, is formed on the active region 'A' of the semiconductor substrate 10. In detail, the first gate of stacked material 22 contains a first conductive layer pattern 14a (i.e., floating gate), a ferroelectric layer pattern 16a and a second conductive layer pattern 18a (i.e., control gate). A gate oxide layer (not shown) is also provided between the first conductive layer pattern 14a and the active region 'A'. The first and second conductive layer patterns 14a and 18a (which are upper and lower electrodes of a ferroelectric capacitor) are preferably refractory metallic layer patterns. For example, the first and second conductive layer patterns 14a and 18a may be formed of a material selected from the group consisting of Pt, Ir, Ru, $RuO_2$ and $IrO_2$,$SrRuO_3$ and(La, Sr)$CoO_3$ and combinations thereof. Also, the ferroelectric layer pattern 16a may comprise PZT, SBT($SrBi_2Ta_2O_9$), SBN($SrBi_2Nb_2O_9$) or SBNT($SrBi_2$(Ta, Nb)$O_9$).

In the active region 'A', between the field oxide layers 12, impurity regions 24 and 26 are provided. The impurity region 24 is a drain region and the impurity layer 26 is a source region. A third conductive layer pattern 34 is also formed on the impurity regions 24 and 26 to provide electrical contacts thereto. An interdielectric layer 39 is formed on the entire surface of the semiconductor substrate 10. The interdielectric layer 39 includes a first via hole 38 which exposes an upper surface of the second conductive layer pattern 18a of the first gate of stacked material 22. The interdielectric layer 39 may be formed of a plurality of stacked insulating layers. For example, the interdielectric layer 39 may be formed of a first insulating layer having contact holes therein which contain the third conductive layer pattern 34 and a second insulating layer having a via hole 38 therein which contains a conductive pad layer 40. The interdielectric layer 39 may be formed of silicon dioxide. The conductive pad layer 40 (i.e., conductive plug) may be formed of a material selected from the group consisting of Al, W, Co, Ni, Pt, Ir, Ru, $RuO_2$, $IrO_2$, Ti, TiN, WN, Ta and Cu.

As described more fully herein below, the first transistor is electrically coupled to a second transistor by the conductive pad layer 40. In detail, an SOI substrate 43 is preferably formed on the conductive pad layer 40 and the interdielectric layer 39. Here, a second via hole 48 exposing the surface of the conductive pad layer 40 is formed in an insulating layer 41 and a conductive plug 50 is formed in the second via hole 48. A second gate 60, consisting of a first oxide layer pattern 56 and a fourth conductive layer pattern 58, is formed on a predetermined portion of a silicon layer pattern 44b. The second gate 60 is spaced from the conductive plug 50 by a predetermined interval. A region 66 under the second gate 60 is a channel region of the transistor. A region 62 is a drain region and a region 64 is a source region. Thus, the insulating layer 41 may contain a monocrystalline silicon layer pattern 44b in which the second transistor (including the second gate 60 and drain and source regions 62 and 64) is formed. The conductive plug 50 and the silicon layer pattern 44b may also consist of polysilicon or amorphous silicon. The second transistor is an access transistor for driving the control gate 18a of the first ferroelectric transistor. A fifth insulating layer 68 is formed on the entire surface of the resultant structure where the second gate 60 is formed. The fifth insulating layer 68 may be formed of a silicon oxide layer. A fifth conductive layer pattern 72 is also provided in a second contact hole 70 formed on the entire surface of the fifth insulating layer 68. As will be understood by those skilled in the art, the fifth conductive layer pattern 72 may be a bit line formed of aluminum (Al).

Figure 2:
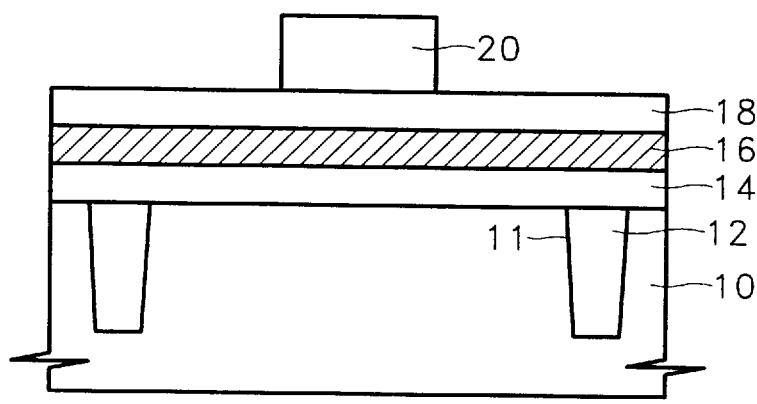
FIGS. 2–13 are cross-sectional views of intermediate structures that illustrate preferred methods of forming the memory device of FIG. 1.

Referring now to FIGS. 2–13, methods of forming the highly integrated FFRAM memory device of FIG. 1 will be described. Referring to FIG. 2, a plurality of trenches 11 are formed in the substrate 10 and then a field ion implantation step is performed. The trenches 11 are then filled with oxide to form field oxide layers 12. The field oxide layers 12 may also be formed using conventional LOCOS techniques. A thin gate oxide layer (not shown) is then grown on the entire surface of the semiconductor substrate 10 where the field oxide layers 12 are formed. A first conductive layer 14, a ferroelectric layer 16 and a second conductive layer 18 are then sequentially formed on the entire surface of the resultant structure where the thin gate oxide layer is grown. The first and second conductive layers 14 and 18 can be formed of a material selected from the group consisting of Pt, Ir, Ru, RuO$_2$, IrO$_2$, SrRuO$_3$ and (La, Sr)CoO$_3$. The ferroelectric layer 16 may be formed of PZT, SBT(SrBi$_2$Ta$_2$O$_9$), SBN (SrBi$_2$Nb$_2$O$_9$) or SBNT(SrBi$_2$(Ta, Nb)O$_9$).

Figure 3:
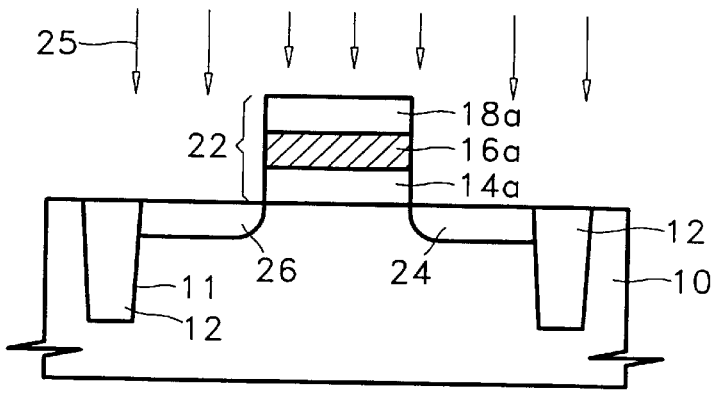

An etching mask 20 defining part of the active region is then formed on the second conductive layer 18. Then, the second conductive layer 18 is anisotropically etched using the etching mask 20. The ferroelectric layer 16 and the first conductive layer 14 are also patterned by the etching step. The etching mask 20 is then removed. As a result of the anisotropic etching step, as shown in FIG. 3, a first gate 22 consisting of the first conductive layer pattern 14a, the ferroelectric layer pattern 16a and the second conductive layer pattern 18a, is formed on the active portion of the substrate 10. As will be understood by those skilled in the art, the first gate 22 acts as a ferroelectric gate capacitor. Conductive impurities are then implanted into the substrate 10 to form the drain region 24 and the source region 26.

Figure 4:
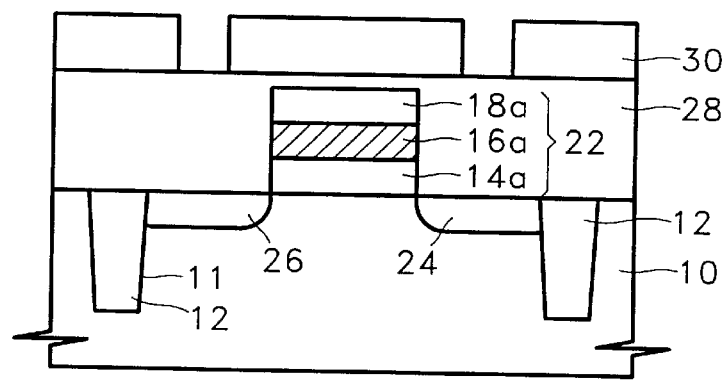
Figure 5:
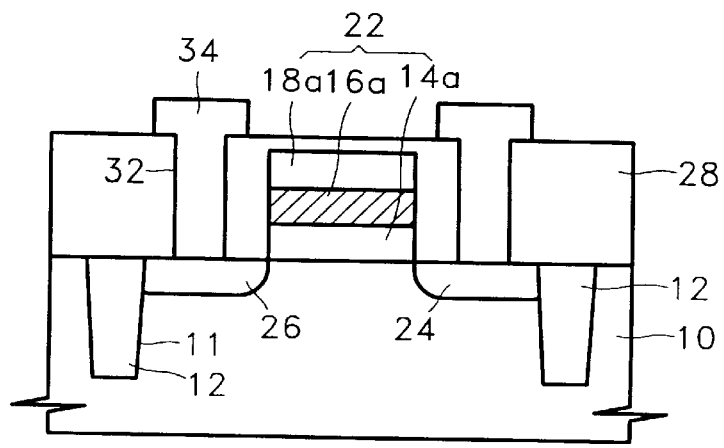

FIG. 4 shows the step of defining contact portions of the drain and source regions 24 and 26. In detail, a first insulating layer 28 is formed on the entire surface of the resultant structure where the first transistor is formed. The first insulating layer 28 may be formed of silicon dioxide. A photosensitive layer pattern 30 is then formed, as illustrated. As shown in FIG. 5, the first insulating layer 28 is anisotropically etched using the photosensitive layer pattern 30 as an etching mask to define contact holes 32 which expose the source and drain regions 26 and 24. A third conductive layer is then deposited on the first insulating layer 28. The third conductive layer is then patterned to define contacts 34 to the source and drain regions 26 and 24.

Figure 6:
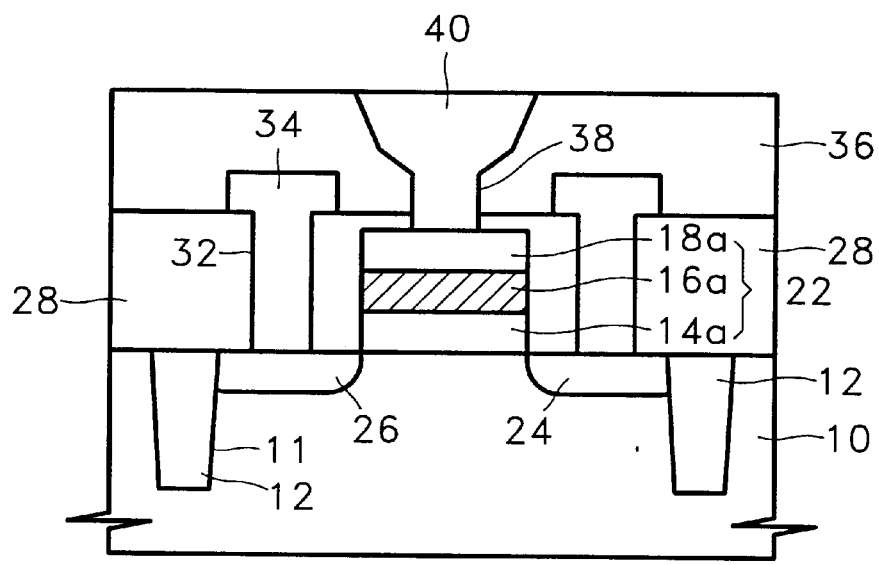

Referring now to FIG. 6, a second insulating layer 36 is formed on the entire surface of the resultant structure of FIG. 5. Then, a photosensitive layer pattern (not shown) is formed on the second insulating layer 36. The second insulating layer 36 and first insulating layer 28 are then anisotropically etched using the photosensitive layer pattern as an etching mask until a surface of the upper electrode 18a of the first gate 22 is exposed. As a result, a first via hole 38 is formed in the second insulating layer 36. Conductive material filling the first via hole 38 is then deposited and planarized until the surface of the second insulating layer 36 is exposed. The planarization step may be performed using a chemical mechanical polishing (CMP) process. Accordingly, a first electrically conductive plug 40 is formed in contact with the second conductive layer pattern 18a (i.e., control gate) of the first gate 22. The plug 40 may be formed of Al, W, Co, Ni, Pt, Ir, Ru, RuO2, IrO2, Ti, TiN, WN, Ta and Cu.

Figure 7:
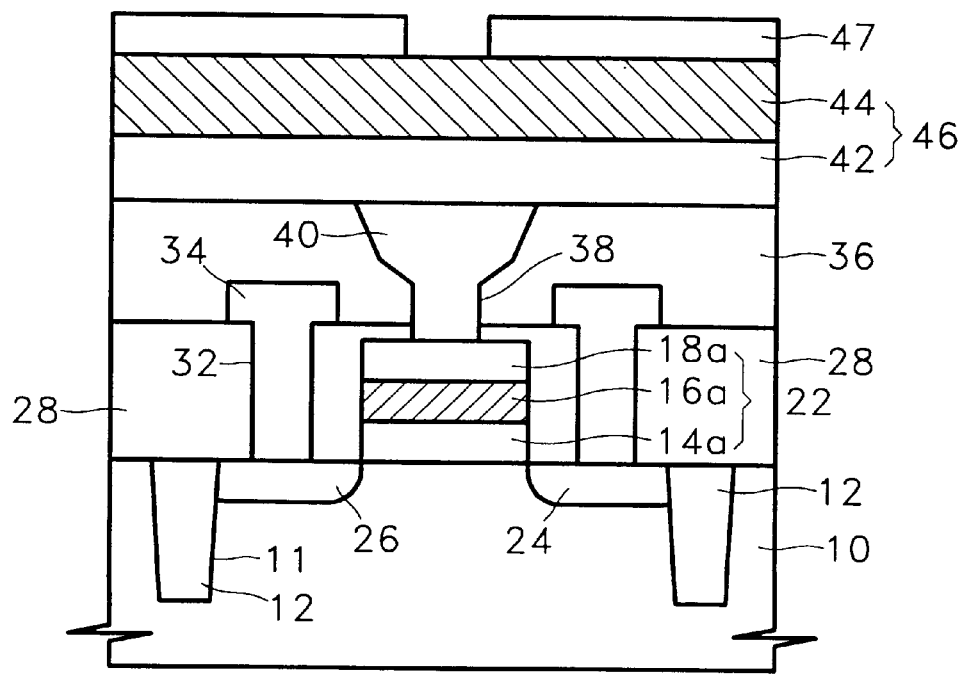
Figure 8:
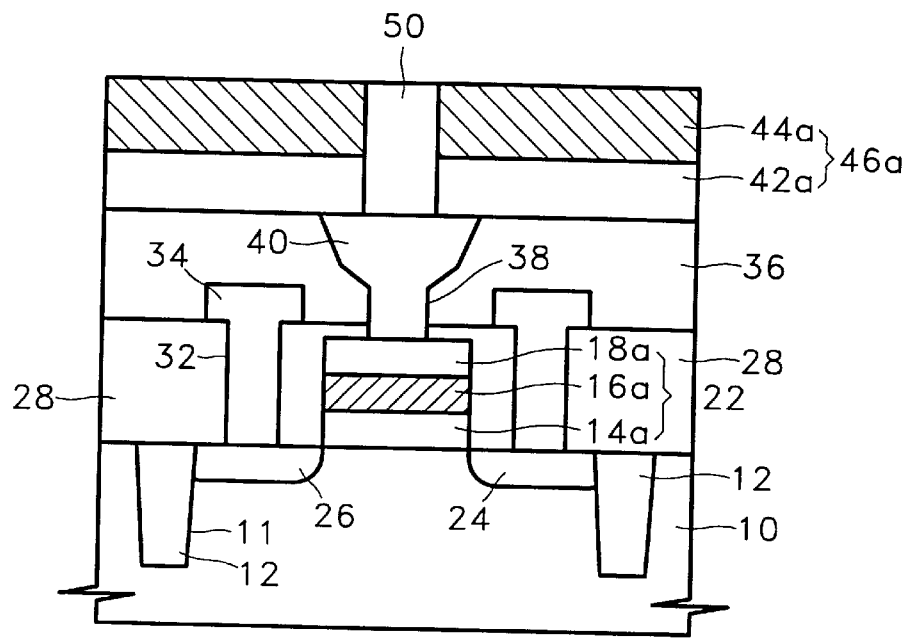

Referring now to FIG. 7, a third insulating layer 42 is formed on a silicon substrate 44 to form an SOI substrate 46. Then, the SOI substrate 46 is inverted and the third insulating layer 42 is bonded to the entire surface formed of the second insulating layer 36 and the first electrically conductive plug 40. The third insulating layer 42 may be formed of a silicon oxide layer. After the SOI substrate 46 is completely bonded, a photosensitive layer pattern 47 is formed on the silicon substrate 44 of the SOI substrate 46. The photosensitive layer pattern 47 may be formed of a photoresist layer. When the silicon substrate 44 of the SOI substrate 46 is anisotropically etched using the photosensitive layer pattern 47 as an etching mask, as shown in FIG. 8, a second via hole 48 exposing part of the surface of the first conductive plug 40, is formed and at the same time a first SOI substrate pattern 46a comprising the third insulating layer pattern 42a and a first pattern 44a of the silicon substrate is formed. Subsequently, conductive material filling the second via hole 48 is formed on the entire surface of the SOI substrate pattern 46a, and then the entire surface is planarized until the surface of the SOI substrate pattern 46a is exposed. The planarization step may be performed using chemical-mechanical polishing. Thus, a second conductive plug 50 is formed in the second via hole 48 in contact with the first conductive plug 40. The second conductive plug 50 may be formed of doped polysilicon, Al or W, for example.

Figure 9:
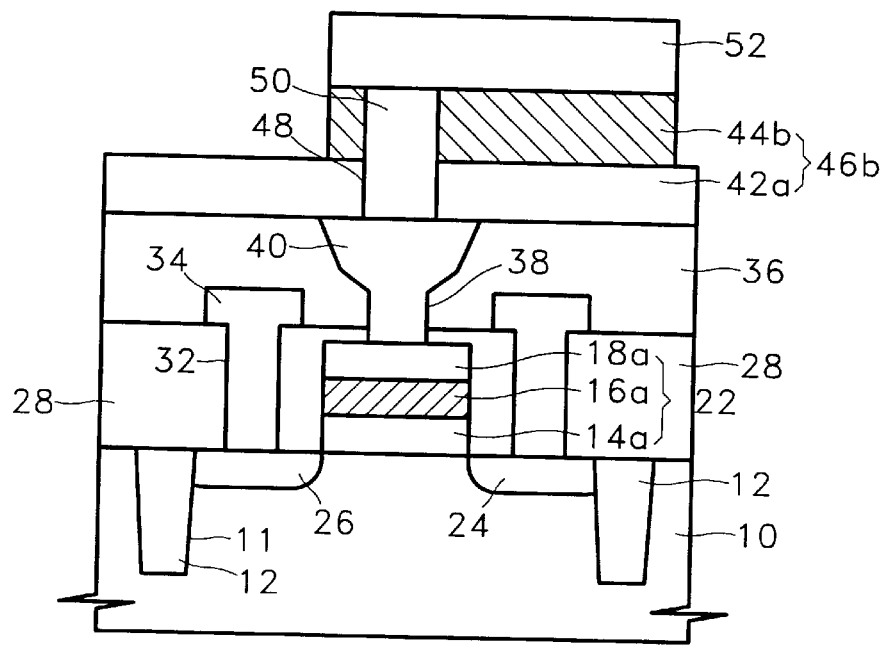
Figure 10:
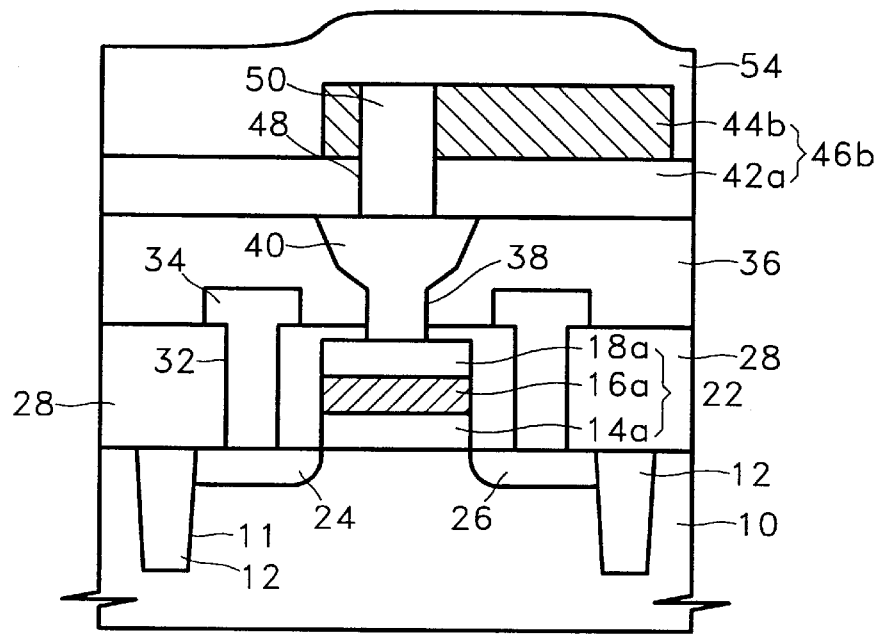

Referring to FIG. 9, a photosensitive layer pattern 52 is formed on the entire surface of the first SOI substrate pattern 46a. The entire surface of the first SOI substrate pattern 46a of FIG. 8 is then anisotropically etched using the photosensitive layer pattern 52 as an etching mask. The anisotropic etching step is performed until a surface of the third insulating layer 42a of the first substrate pattern 46a of FIG. 8 is exposed. As a result, a second pattern 44b of the silicon substrate and a second SOI substrate pattern 46b are formed. Then, the photosensitive layer pattern 52 is removed. A fourth insulating layer 54, as shown in FIG. 10, is then formed on the entire surface of the second SOI substrate pattern 46b to a thickness appropriate for planarizing. The fourth insulating layer 54 is then planarized through a CMP process. The CMP process is performed until a surface of the second pattern 44b is exposed.

Figure 11:
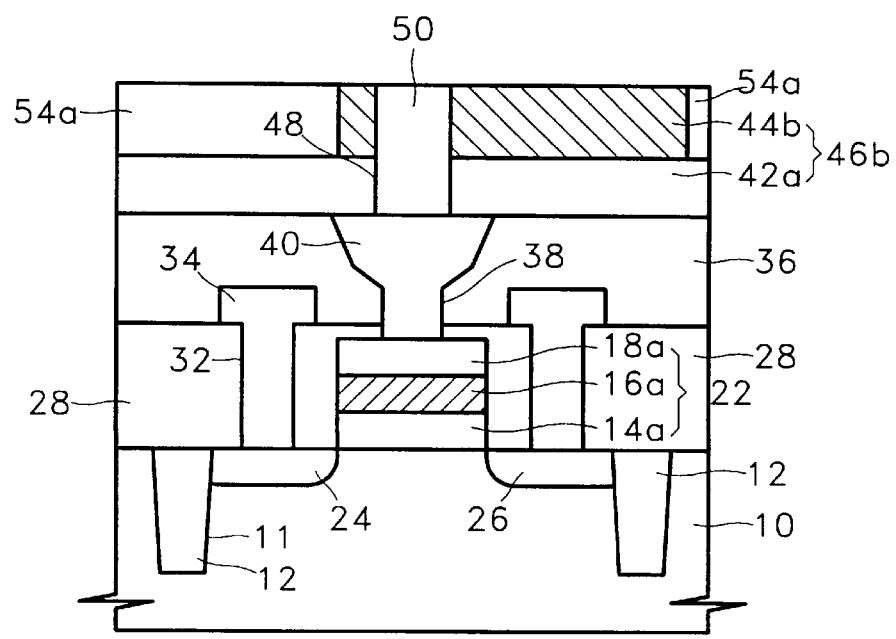

Accordingly, as illustrated by FIG. 11, the planarized surface of the resultant structure exposes the second pattern 44b of the silicon substrate, the fourth insulating layer pattern 54a and the second conductive plug 50.

Figure 12:
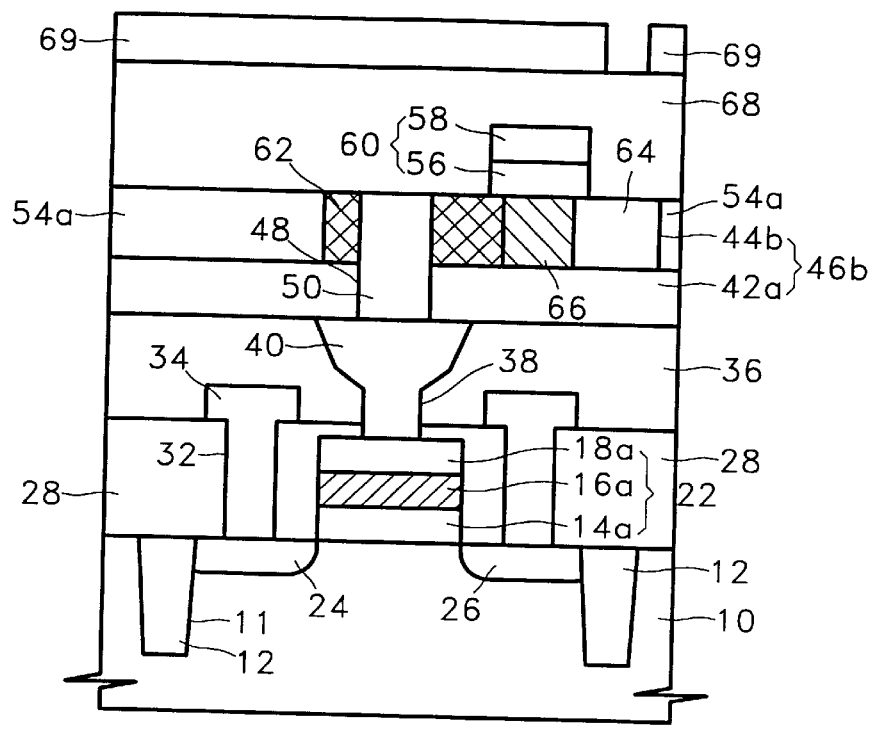

FIG. 12 shows the step of forming a second transistor. In detail, a second insulated gate electrode 60 consisting of a gate oxide film pattern 56 and a fourth conductive layer pattern 58 is formed on the second pattern 44b of the silicon substrate. Conductive impurities are then implanted into the entire surface of the second pattern 44b of the silicon substrate using the second gate electrode 60 as a mask. As a result, a drain region 62 and a source region 64 are formed. The region 66 between the drain and source regions 62 and 64 is a channel region. The second transistor is connected to the control gate by the second conductive plug 50. The second transistor acts as an access transistor and is integrated vertically to increase the level of integration. A fifth insulating layer 68 is then formed to cover the second gate 60. The entire surface of the fifth insulating layer 68 can also be planarized so long as the second gate 60 is not exposed. Then, a photosensitive layer pattern 69 is formed on the entire surface of the fifth insulating layer 68.

Figure 13:
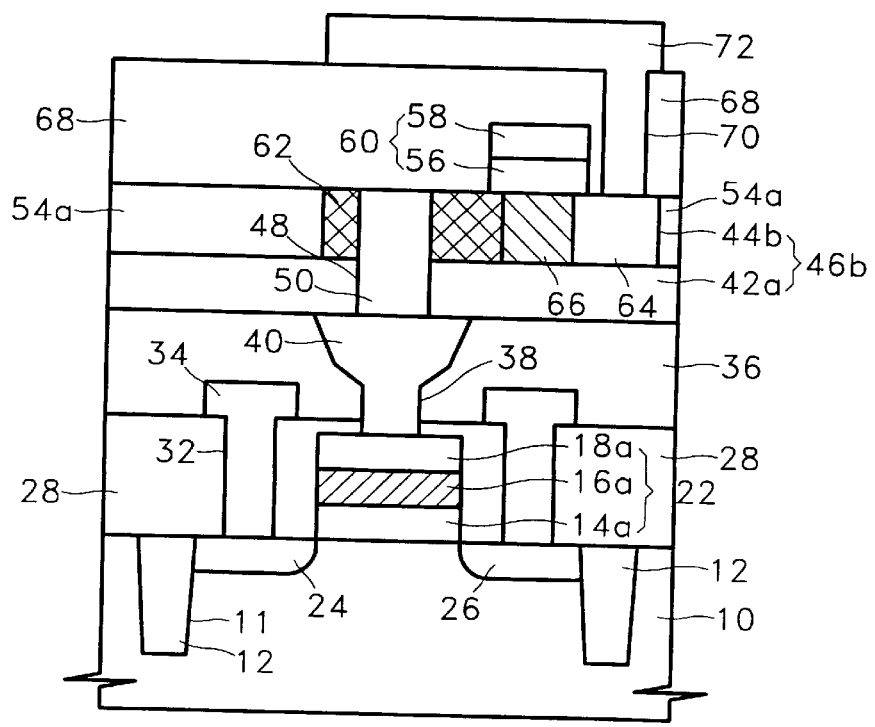

FIG. 13 shows the step of forming a fifth conductive layer pattern 72 used for a bit line. In detail, the entire surface of the fifth insulating layer 68 is anisotropically etched using the photosensitive layer pattern 69 as an etching mask. The anisotropic etching step is performed until the surface of the source region 64 of the second transistor is exposed. Accordingly, a second contact hole 70 exposing a surface of the source region 64 of the second transistor is formed in the fifth insulating layer 68. Then, the fifth conductive layer pattern 72 filling the second contact hole 70 is formed on the entire surface of the fifth insulating layer 68, and then it is patterned. The fifth conductive layer pattern 72 acts as a bit line.

According to a second embodiment of the present invention, the steps of forming the SOI substrate 46 of FIG. 7 by forming an insulating layer 42 on a silicon substrate 44 and then inverting the structure and bonding the insulating layer 42 to the second insulating layer 36, may be replaced with alternative steps. In particular, an SOI substrate may be formed having a silicon upper surface and then the silicon upper surface may be inverted and bonded directly to the second insulating layer 36 and conductive plug 40. The inverted SOI substrate may then be planarized until the silicon layer within the SOI substrate is exposed. Thus, when view in cross-section, the structure according to the second embodiment will be similar to the cross-sectional view of FIG. 7, however, the insulating layer 42 will be omitted. Furthermore, according to this embodiment, the need to form a conductive plug 50 may be eliminated since direct electrical contact can be made between the silicon layer 44 and the conductive plug 40.

According to a third embodiment of the present invention, the steps of forming the SOI substrate 46 of FIG. 7 may be omitted by forming a third insulating layer on the second insulating layer 36 and then forming a contact hole in the third insulating layer. The contact hole is formed to expose the electrically conductive plug 40. Then, an amorphous or polycrystalline silicon layer is conformally deposited on the third insulating layer and in the contact hole. In the event a layer of amorphous silicon is deposited, an annealing step may be preferably performed to convert the amorphous silicon to polycrystalline silicon. The deposited silicon layer may then be patterned using conventional techniques to define a layer of silicon similar to the silicon layer 44b in FIG. 9. According to a fourth embodiment, a third insulating layer may be formed on the second insulating layer 36 and then a contact hole may be formed in the third insulating layer to expose the electrically conductive plug 40. The contact hole is then filled with an electrically conductive layer and then the electrically conductive layer is planarized to expose an upper surface of the third insulating layer and define a upper conductive plug that is electrically connected to the conductive plug 40. A layer of silicon material may then be deposited on the planarized surface of the third insulating layer and then patterned to define a region of silicon (in which an access transistor is to be formed) that is electrically coupled to the conductive plug 40. According to these third and fourth embodiments, the access transistor may be formed as a TFT.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a ferroelectric memory device, comprising the steps of:

forming a first transistor having opposing floating and control gate electrodes, at a surface of a semiconductor substrate;

forming a first insulating layer having a first contact hole therein, on the first transistor;

forming a first electrical interconnect in the first contact hole, electrically coupled to the control gate electrode; and forming a second transistor on the first insulating layer, said second transistor having a drain region therein electrically coupled by the first electrical interconnect to the control gate of the first transistor.

2. The method of claim 1, wherein said step of forming a second transistor comprises the step of forming a silicon-on-insulator substrate on the first insulating layer.

3. The method of claim 2, wherein said step of forming a second transistor comprises the step of forming a second contact hole in the silicon-on-insulator substrate, to expose the first electrical interconnect.

4. The method of claim 3, wherein said step of forming a second transistor comprises the step of forming a second electrical interconnect in the second contact hole.

5. The method of claim 4, wherein said step of forming a second transistor comprises the steps of forming an insulated gate electrode on the silicon-on-insulator substrate and implanting dopants into the silicon-on-insulator substrate, using the insulated gate electrode as a mask.

6. The method of claim 5, further comprising the step of forming a bit line coupled to the silicon-on-insulator substrate.

7. The method of claim 1, wherein said step of forming a second transistor comprises the steps of:

forming a second insulating layer on the first insulating layer;

forming a second contact hole in the second insulating layer, to expose the first electrical interconnect;

depositing a layer of nonmonocrystalline silicon on the second insulating layer and in the second contact hole;

patterning the deposited layer of nonmonocrystalline silicon;

forming an insulated gate electrode on the deposited layer of nonmonocrystalline silicon; and forming a bit line electrically coupled to the deposited layer of nonmonocrystalline silicon.

8. The method of claim 7, wherein said step of depositing a layer of nonmonocrystalline silicon comprises depositing a layer of amorphous silicon.

9. The method of claim 8, further comprising the steps of recrystallizing the layer of amorphous silicon as polycrystalline silicon.

10. The method of claim 1, wherein said step of forming a second transistor comprises bonding a layer of silicon to the first insulating layer and the first electrical interconnect.

11. The method of claim 1, wherein said step of forming a first transistor comprises forming a layer of ferroelectric material between the floating and control gate electrodes.

12. The method of claim 1, wherein said step of forming a first transistor comprises the steps of:

forming a gate oxide layer on the surface of the semiconductor substrate;

forming a composite layer containing a first conductive layer, a ferroelectric layer and a second conductive layer, on the gate oxide layer;

patterning the composite layer to define the floating and control gate electrodes; and implanting dopants into the surface of the semiconductor substrate, using the floating and control gate electrodes as an implant mask.

13. The method of claim 12, wherein the first and second conductive layers comprise a material selected from the group consisting of Pt, Ir, Ru, $RuO_2$, $IrO_2$, $SrRuO_3$ and $(La, Sr)CoO_3$; and wherein the ferroelectric layer comprises a material selected from the group consisting of PZT, SBT $(SrBi_2Ta_2O_9)$, SBN$(SrBi_2Nb_2O_9)$ and SBNT$(SrBi_2(Ta, Nb)O_9)$.

* * * * *